United States Patent [19]
Marrocco, III

[11] Patent Number: 4,945,257
[45] Date of Patent: Jul. 31, 1990

[54] ELECTRICALLY SETTABLE RESISTANCE DEVICE

[75] Inventor: Matthew L. Marrocco, III, Santa Ana, Calif.

[73] Assignee: Maxdem Incorporated, Pasadena, Calif.

[21] Appl. No.: 274,442

[22] Filed: Nov. 18, 1988

Related U.S. Application Data

[63] Continuation-in-part of Ser. No. 78,836, Jul. 28, 1987, abandoned.

[51] Int. Cl.$^5$ .......................... G06G 7/06; H03H 11/00
[52] U.S. Cl. ...................................... 307/201; 338/38; 338/80; 361/500; 364/276.9; 364/513; 364/807
[58] Field of Search ..................... 307/201; 338/38, 44, 338/80, 222; 364/807, 513, 276.6–276.9; 361/433–434

[56] References Cited

U.S. PATENT DOCUMENTS

| | | | |
|---|---|---|---|
| 3,245,836 | 4/1966 | Agruss | 136/83 |
| 3,304,351 | 7/1968 | Martin | 340/172.5 |
| 3,395,402 | 7/1968 | Widrow et al. | 340/173 |
| 3,499,796 | 3/1970 | Hever et al. | 136/83 |
| 3,597,625 | 8/1971 | Yanai et al. | 307/201 |
| 3,599,009 | 8/1971 | Parmentier et al. | 307/201 |
| 3,710,201 | 1/1973 | Ikeda et al. | 317/230 |
| 3,753,110 | 8/1973 | Ikeda et al. | 324/182 |
| 3,824,130 | 8/1974 | Liang | 136/83 |
| 3,843,400 | 10/1974 | Redford et al. | 117/227 |
| 4,038,586 | 7/1977 | Sekido et al. | 361/435 |
| 4,112,409 | 9/1978 | Jacquelin | 338/222 |
| 4,163,982 | 8/1979 | Di Domenico, Jr. et al. | 357/2 |
| 4,163,983 | 8/1979 | Cline et al. | 357/12 |
| 4,164,004 | 8/1979 | Saito | 361/433 |
| 4,187,161 | 2/1980 | Fischer | 204/195 |
| 4,187,530 | 2/1980 | Singh et al. | 361/433 |
| 4,241,149 | 12/1980 | Labes | 429/50 |
| 4,294,898 | 10/1981 | Hartstein | 429/104 |
| 4,343,871 | 8/1982 | Tobishima et al. | 429/197 |
| 4,366,216 | 12/1982 | McGinness | 429/213 |
| 4,485,154 | 11/1984 | Remick et al. | 429/14 |
| 4,504,557 | 3/1985 | Filatovs et al. | 429/192 |
| 4,576,878 | 3/1986 | Gahn | 429/15 |
| 4,660,166 | 4/1987 | Hopfield | 364/807 |
| 4,719,591 | 1/1988 | Hopfield et al. | 364/807 |
| 4,731,747 | 3/1988 | Denker | 364/807 |
| 4,782,460 | 11/1988 | Spencer | 307/201 X |

FOREIGN PATENT DOCUMENTS 0623214  8/1978  U.S.S.R. .

OTHER PUBLICATIONS

Bushnor, "An experiment in Learning", Electronics, Jul. 1960, pp. 56–59.
J. W. Thackeray et al, "Poly(3,methylthiophene)–Coated Electrodes: Optical and Electrical (List continued on next page.)

Primary Examiner—David Hudspeth
Attorney, Agent, or Firm—Christie, Parker & Hale

[57] ABSTRACT

A device provides an electrically settable resistance and comprises first and second electrodes. Each electrode comprises a redox active material. The device further comprises means defining an environment for each electrode such that the average redox state of the electrodes, taken together, remains substantially constant. The environment-defining means includes an electrolyte between the electrodes. The device further comprises a pair of terminals electrically connected to the first electrode at spaced-apart locations, the electrically settable resistance being defined between the pair of terminals and being a function of the oxidation state of the first electrode. The device further comprises means, including a terminal electrically connected to the second electrode, for defining a control circuit path, including the first and second electrodes and the electrolyte, to enable a control current flowing through the control circuit path to change the oxidation state of the first electrode so that control current flowing in one direction sets the resistance to a lower value and control current flowing in the opposite direction sets the resistance to a higher value.

32 Claims, 6 Drawing Sheets

OTHER PUBLICATIONS

Properties as a Function of Redox Potential and Amplification of Electrical and Chemical Signals Using Poly(-3-methylthiophene)-Based Microelectrochemical Transistors," J. Phys. Chem., 89 pp. 5133–5140 (1985).

E. T. T. Jones et al, "Preparation and Characterization of Molecule-Based Transistors with a 50-nm Source-Drain Separation with Use of Shadow Deposition Techniques: Toward Faster, More Sensitive Molecule-Based Devices," J. Am. Chem. Soc., 109, pp. 5226–5228 (1987).

E. P. Lofton et al, "Amplification of Electrical Signals with Molecule-Based Transistors: Power Amplification Up to Ailohertz Frequency and Factors limiting Higher Frequency Operation," J. Phys. Chem. 90, pp. 6080–6083 (1986).

E. W. Paul et al, "Resistance of Polyaniline Films as a Function of Electrochemical Potential and the Fabrication of Polyaniline-Based Microelectronic Devices," J. Phys., Che4m., 89, pp. 1441–1447 (1985).

G. P. Kittlesen et al, "Chemical Derivatization of Microelectrode Arrays by Oxidation of Pyrrole and N-Methylpyrrole": Fabrication of Molecule-Based Elecronic Devices, J. Am. Chem. Soc., 106, pp. 7389–7396 (1984).

J. C. Jernigan et al, "A Benzimidazobenzophenanthroline Polymer Molecular Transistor Fabricated Using Club Sandwich Electrodes," J. Electroanal, Chem., 22, pp. 193–200 (1987).

R. A. Reed et al, "Solid State Voltammetry of Electroactive Solutes in Polyethylene Oxide Polymer Films on Microelectrodes," J. Electroanal. Chem., 208, pp. 185–193 (1986).

J. J. Hopfield, "Neural Networks and Physical Systems with Emergent Collective Computational Abilities," Proc. National Acad. Sci., 79, pp. 2554–2558 (1982).

L. D. Jacket et al, "Artificial Neural Networks for Computing," J. Vac. Sci. technol., B. vol. 4, No. 1, Jan./Feb. 1986, pp. 61–63.

J. J. Hopfield et al, "Computing with Neutral Circuits: A model," Science, 233, pp. 625–633 (1986).

Paper by T. J. Sejnowski et al titled "Boltzmann Machines: Constraint Satisfaction Networks That Learn," published by the Department of Computer Science, Carnegie Mellow University, as Technical report CMU-CS-84-119 (1984).

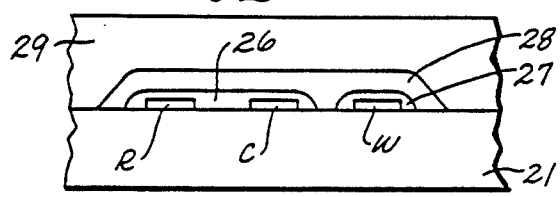
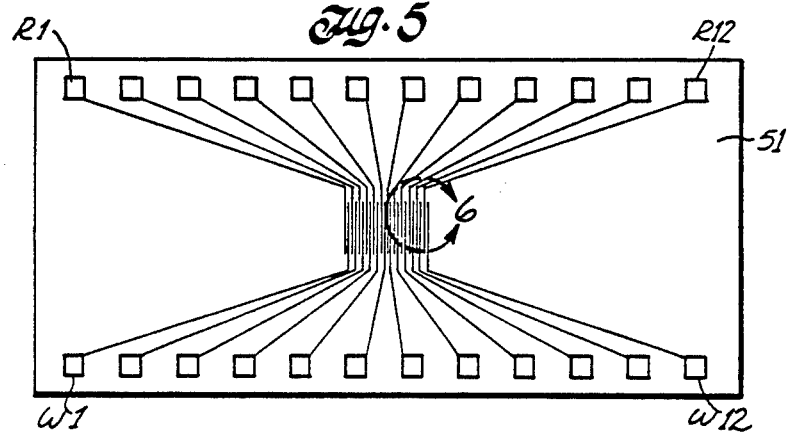
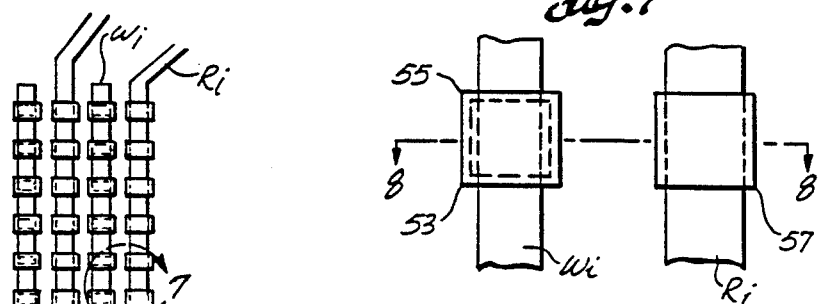
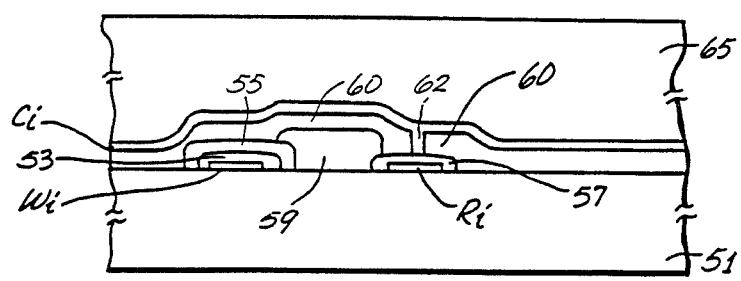

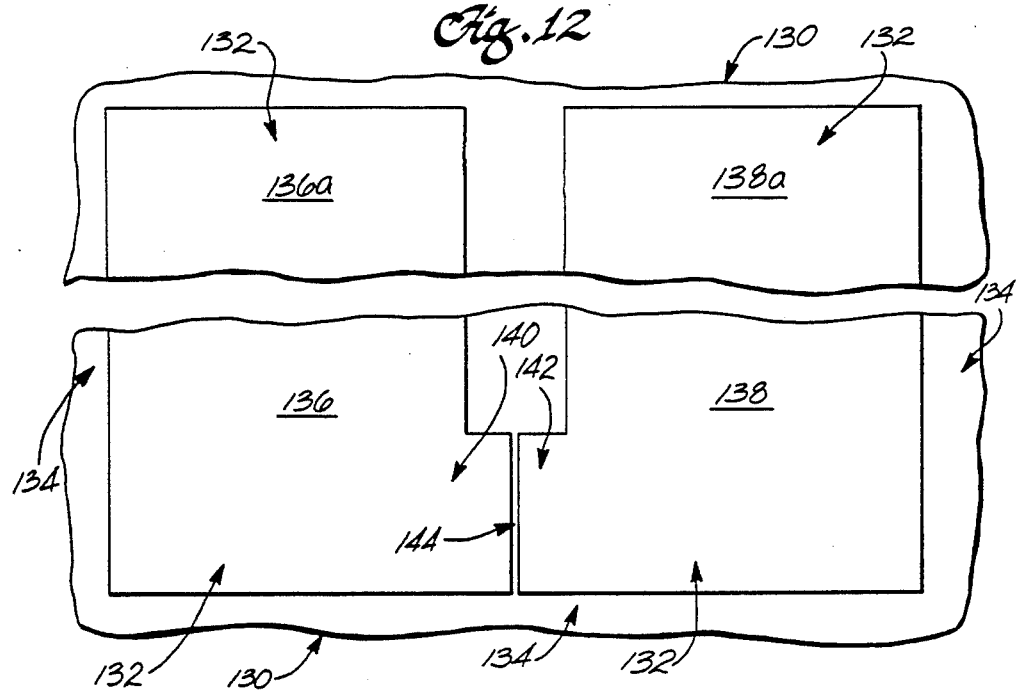
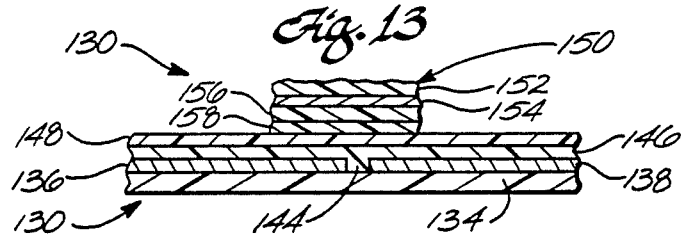
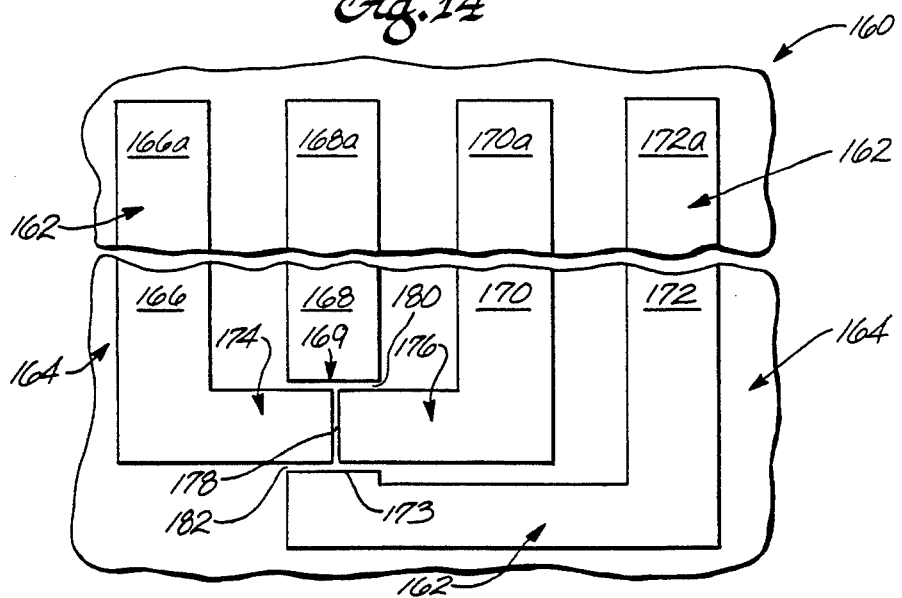

ELECTRICALLY SETTABLE RESISTANCE DEVICE

CROSS-REFERENCE TO RELATED APPLICATION

The application is a Ser. No. 078,836, filed July 28, 1987, now abandoned which is incorporated herein by this reference.

BACKGROUND OF THE INVENTION

In general, this invention relates to an electrically settable resistance device; more particularly, it relates to such a device that is adapted to be micro-miniaturized and to circuit arrangements including a multitude of such devices.

Circuit devices that exhibit memory have a wide and continually increasing spectrum of uses in many kinds of circuit arrangements for performing various functions in such diverse applications as communications, control systems, and computers. In such applications, the kinds of circuit arrangements in which memory devices are used include sequential switching circuits, in which the memory devices are interconnected with combinatorial logic circuits such as AND gates, OR gates, and the like. Other kinds of circuit arrangements, especially in the digital computer field, include registers within data processors and addressable memories in which many memory devices are interconnected in a matrix arrangement to provide for storage of data.

For sequential switching circuit applications and for registers within data processors, the memory devices must be erasable, i.e., be adapted to change state repeatedly during circuit operation. Likewise, memory devices for a random access memory (RAM) need to be erasable so that new data can be written into the memory during data processing operations. Another type of memory, called a read only memory (ROM), is written into before the memory is connected into the computer or other system and has the limited function of providing read out of predetermined stored data.

Highly desirable characteristics for a memory device include small size, low-power dissipation, long life, and high reliability. Substantial research and development has been directed for many years to make progress in achieving such desirable characteristics. Such research and development has involved diverse areas of technology, including magnetics, particularly with respect to magnetic cores, on a large scale for a number of years and on an on-going basis with moving magnetic media such as tape or disk; and including solid state physics, particularly with respect to junction transistors and metal oxide semiconductor transistors.

As to such progress, the integrated semiconductor chips used today contain many more memory devices than could ever have been practical using magnetic cores and generally operate faster and with less power dissipation. However, moving media storage such as magnetic tape and disk, and optical disk, is still generally required for mass storage. Commercially available "hard" or "Winchester" disks generally provide hundreds of times more storage capacity than semiconductor memories. For example, there are personal computers presently on the market that accept an optional hard disk capable of storing in excess of 100 megabytes (MB). In comparison, a one megabit dynamic random access memory (DRAM) chip, eight of which are needed at a minimum for each byte, provides the maximum capacity for semiconductor memory currently available commercially. It has been reported that a four megabit DRAM chip has been made. As to a static RAM memory chip, its organization is such that more transistors are required to define a memory cell. Because of its organization, such a static RAM chip generally has four times less density than a DRAM chip.

Solid state memory has inherent advantages of speed, low power consumption, and high reliability over moving media memory such as tape and disk. In many applications, it is impossible or impractical to use any moving parts. There are many military and other applications, including deep space missions, that impose stringent requirements narrowing available options to solid state memory. These stringent requirements include low power consumption, not only on average so as not to drain batteries or other sources of electric power, but also on a transient basis so as not to generate undue heat, fast access, radiation hardness, and high reliability.

Recent progress in increasing density in semiconductor memory is attributable to successes in reducing the size of the component transistors. It appears likely that, by following this approach, further progress toward higher density in semiconductor memory will become increasingly difficult. The smallest feature of these component transistors is now typically 1.5 microns or less. The ultimate limit of the optical lithography techniques in current use is about 0.5 micron. Smaller dimensions will require development of new lithographic techniques that have been suggested, such as e-beam or x-ray lithography. Furthermore, physical limitations place an ultimate limit on minimum transistor size. For example, the commonly used dopant 35 concentration of $10^{16}$ cm$^{-3}$ provides only 10 dopant atoms in a cube 0.1 micron on a side. In addition, dealing with such factors as line resistance and edge capacitance becomes increasingly difficult as transistor size is reduced.

As stated above, memory devices are incorporated within data processors as well as within random access memories. As incorporated within data processors such as integrated circuit microprocessors, the memory devices are arranged into registers for storing program code and data manipulated in accord with the sequentially executed program code to produce an algorithmic solution to a problem. Digital computers, as conventionally organized, can, by virtue of large memory capacity and high speed components, compute solutions to arithmetic problems and retrieve records from data bases far faster than is humanly possible.

A digital computer program includes written definitions of data structures and written program code for instructing a digital computer to perform sequential tasks in manipulating data organized in accord with such defined data structures. With respect to many problems, a person having ordinary skill in the art of writing digital computer programs can relatively easily and quickly write a digital computer program that a digital computer can execute to solve the problem. Particularly for applications such as accounting systems, word processing systems, and other systems that perform repetitious tasks, the amount of time it takes to write such a digital computer program is small compared to the amount of time saved by having the digital computer manipulate the varying data in accord with the same defined algorithms.

However, many problems within a broad class of problems are impractical to solve by the conventional approach of writing and executing such digital computer programs. A representative type of such problem involves pattern recognition. Even a young child can recognize a pattern far more quickly than can the most powerful digital computer with extremely elaborate programming. The ability of the human brain to solve such problems, which are essentially impractical for a programmed digital computer to solve, has led researchers, such as J. J. Hopfield, to analyze how signals propagate within nerve cells and to propose construction of apparatus that would operate in an analogous way. Among these proposals are various proposed types of networks within a general class called electronic neural networks (ENNs). The literature concerning the various types of an ENN includes : J. J. Hopfield, *Proc. National Acad. Sci.*, Vol. 79, pp. 2554 et seq. (1982); L. D. Jackel et al., *J. Vac. Sci. Technol.* B, Vol. 4, pp. 61 et seq. (1986); J. J. Hopfield et al., *Science.* Vol. 233, pp. 625 et seq.; a paper by T. J. Sejnowski et al., titled "*Boltzmann Machines: Constraint Satisfaction Networks That Learn,*" published by the Department of Computer Science, Carnegie Mellon University, as Technical Report CMU-CS-84-119 (1984); and a book titled *Parallel Processino, Volume 1 Foundations,* published by MIT Press, Cambridge Mass., 1986.

Every ENN comprises a set of amplifiers interconnected through a network of resistors. The amplifiers may have various input/output specifications; the output of an amplifier may be a linear or a non-linear function of its input.

One type of ENN is called a Hopfield ENN, which has the following characteristics: (1) The amplifiers are nonlinear; (2). In the general case, the output of every amplifier is connected through resistive elements to the inputs of all the amplifiers; (3) The resistive element connected between the output of any amplifier i and the input of any amplifier j has substantially the same resistance as the resistive element connected between the output of amplifier j and the input of amplifier i. In a Hopfield ENN, the input/output specification for each amplifier is usually such that the output is a sigmoid monotonic function of the input. Such a sigmoidal input/output specification is shown in the above-cited article in Science (see FIG. 3(A) at page 628). The curve shown in that FIG. 3(A) may be displaced along either axis; it also may be inverted about either axis. J. J. Hopfield has shown that a Hopfield ENN may be described mathematically and has certain desirable features. One such desirable feature is that, for any input state, there is a unique stable output state. The resistive elements used in a Hopfield ENN are adjusted to "program" the ENN for a specific problem or to store information in the ENN for later recall.

In a Hopfield ENN comprising a set of N amplifiers, an array of $N^2$ resistors must be provided. Each resistor must be settable to provide a particular resistance value that corresponds to a strength of connection from one nerve to another. This requirement that the resistor be "settable" to a value means that the resistor must exhibit memory. The computing power of a Hopfield ENN increases with the number of resistors in the array. Accordingly, high density is highly desirable in this context, just as high density is highly desirable in a RAM. A Hopfield ENN with an array of $1024 \times 1024$ resistors becomes feasible only if the individual resistors can be made as small as about a 1 micron square.

In addition to a Hopfield ENN, other types of an ENN are known. Another example of a type of ENN is called a "layered neural network." A layered neural network typically has two or more sets or layers of amplifiers arranged in a hierarchy such that the output of each amplifier is connected to the inputs of only those amplifiers in a succeeding layer. Some of these amplifiers, especially those in the first layer, may be linear amplifiers. Such a layered neural network is a "feed forward" ENN because there is no connection from the output of an amplifier in a higher layer to the input of an amplifier in a lower layer. An example of a layered neural network is described in and referred to as a Boltzmann Machine in the above-cited paper by Sejnowski et al. A layered neural network is often used as a learning network. This means that the resistive elements are iteratively altered during "training" cycles in which the output derived from a known input is compared to a "desired output"; then an algorithm is used to compute new values for the resistive elements for the next iteration.

With respect to the programming of an ENN, the Jackel et al. reference cited above discloses an ENN in which each resistor has an individually fixed value to define pre-programmed synapses. Other ENN's that are programmable have been built using numerous switching transistors for selectively connecting and disconnecting resistors into and out of the neural net to provide programmable binary synapses; however, each such binary synapse has required 10 to 20 transistors.

It is desirable to provide not only programmable synapses, but also more than two resistance values per synapse, as is the case with a binary synapse. Providing for more than two resistance values per synapse would be very difficult with existing technology. Extending the switching transistor approach taken in providing programmable binary synapses would entail hundreds of transistors per synapse, and this would severely limit the number of synapses for the neural net.

SUMMARY OF THE INVENTION

This invention provides a novel and highly advantageous electrically settable resistance device and circuit arrangements including a multitude of such devices. The device is adapted to be micro-miniaturized and to be incorporated into any of a variety of circuit arrangements and has particular advantages as a memory device for a high-density random access memory and as a settable resistor for a high-density resistor network.

The invention can be defined in various terms. According to one definition, the invention resides in a device for providing an electrically settable resistance. The device comprises first and second electrodes, each comprising redox active material. Means define an environment for each electrode such that its redox active material is reversible. The environment-defining means includes an electrolyte between the electrodes. A pair of terminals are electrically connected to the first electrode at spaced-apart locations. The electrically settable resistance is defined between the pair of terminals and is a function of the oxidation state of the first electrode. The device further includes means, including a terminal electrically connected to the second electrode, for defining a control circuit path, including the first and second electrodes and the electrolyte, to enable a control current flowing through the control circuit path to change the oxidation state of the first electrode so that control current flowing in one direction sets the resistance to a lower value, and control current flowing in the opposite direction sets the resistance to a higher value.

As to the terminology used in the foregoing definition of the invention, "redox active" means that the material has at least two oxidation states which are accessible by either chemical or electrochemical means. A device embodying this invention may be used as a two-state device, i.e., as a switch that is electrically settable to provide either a high resistance or a low resistance. Alternatively, a device embodying the invention and replicated to form a resistance network of a neural net may be used to define a multiplicity of resistance values, with each of the many resistance values corresponding to a different one of many intermediate oxidation states. Whether the material has two or more states, any two of the states constitute a redox couple. The term "reversible" further defines the redox active material as being capable in its environment, following oxidation or reduction between states of a redox couple, to re-reduce or re-oxidize essentially fully.

The reversibility of a given redox active material depends upon its environment, i.e., any contacting solid, liquid or vapor phase(s), pressure and temperature, state of illumination or presence of other fields or gradients. For example, the material Prussian Blue/Berlin Green is a redox active material that can be used for an electrode in a device embodying this invention if the electrode is in an appropriate environment in which platinum is used as the material terminals contacting the electrode, and in which aqueous KCl is used as the material for the electrolyte in contact with the electrode. On the other hand, the Prussian Blue/Berlin Green redox couple is irreversible on platinum if aqueous tetramethylammonium chloride is the electrolyte.

Further with respect to the term "reversible" and the converse term "irreversibility" as applied to a redox active material, each embraces both chemical and electrochemical matters. A redox active material is chemically irreversible if, during oxidation or reduction, a substantial portion of the material, such as a portion in excess of 1%, is converted into a reaction product that cannot be re-reduced or re-oxidized.

Electrochemical reversibility is a kinetic property and can be quantified as the electrochemical rate constant for electron exchange within the context of specified materials and environment. The time required to change the resistance setting of a device embodying this invention is an inverse function of the electrochemical rate constant and is also a function of potential applied to produce the control current. It is undesirable for the applied potential to substantially exceed the thermodynamic potential, for this results in energy inefficiency and production of waste heat. A portion of the applied voltage is due to electrochemical irreversibility. That portion is called the Faradaic overpotential. A redox active material meets the need for electrochemical reversibility for an electrode in an embodiment of this invention only if the time during which the resistance is to remain set is long compared to the time required to change the resistance setting and if the Faradaic overpotential is less than one volt.

Each of a variety of redox active materials exhibits reversibility and is suitable for use in the electrodes of, and in the environment provided within, a device embodying this invention.

According to another definition, the invention resides in a thin film structure comprising a substrate supporting a multiplicity of cells, each cell providing an individually electrically settable resistance. Each cell includes at least three layers or deposits of materials. One deposit of material is a redox active material defining a first electrode. Another deposit of material is a redox active material defining a second electrode. Another deposit of material defines an electrolyte between the first and second electrodes. The substrate further supports a multiplicity of conductors arranged in a pattern to communicate electrically with a cell such that, at each cell, two of the conductors are electrically connected to the first electrode at spaced-apart locations. These two conductors are referred to in the detailed description of a specific embodiment as a read (R) conductor and a common (C) conductor. The electrically settable resistance of the cell is defined between such two conductors. Further as to each cell, another of the conductors is electrically connected to the second electrode for defining a control circuit path. This conductor is referred to in a detailed description of a specific embodiment as a write (W) conductor. The control current path includes the first and second electrodes and the electrolyte. A control current flowing through the control current path in one direction sets the resistance of the cell to a lower value, and, in the opposite directions sets it to a higher value. In accord with an advantageous feature, a fourth layer or deposit is provided for each cell. This fourth deposit has a non-linear resistance and electrically connects the W conductor to the second electrode so that, in an operation to set the resistance of a cell, a potential in excess of a predetermined threshold is used to set a cell resistance on an individually selected basis.

According to another definition of the invention, it resides in an electronic neural network comprising a set of amplifiers and multi-cell means embodied in thin film structure for inter-connecting amplifiers to establish the strengths of connection between the amplifiers. The multicell means defines a network of electrically settable resistances, each of which is formed by a redox active material and has a resistance value that is a function of the oxidation state of the redox active material.

According to another definition of the invention, it resides in a memory device comprising a set of electrically settable resistances, means for connecting the electrically settable resistances into an addressable array, means for coding and decoding memory addresses, and means for electronic input to and output from the memory device, including address lines and data lines.

The foregoing and other advantageous features of the invention are described in detail below and recited in the appended claims.

BRIEF DESCRIPTION OF THE DRAWINGS

FIG. 4 is a semi-schematic cross-section taken along line 4-4' of FIG. 3, with some of the features being shown on an enlarged scale for clarity;

FIG. 5 shows in a top plan view how conductors and terminating pads are laid down on a substrate to form an array in the course of making a thin film structure described in Example 3 of the invention;

FIG. 6 is an enlarged plan view of an area indicated at 6-6' in FIG. 5 at a subsequent stage in the course of making the thin film structure;

FIG. 7 is an enlarged plan view of the area indicated at 7-7' in FIG. 6;

FIG. 8 is a cross-section of the completed thin film structure taken along line 8-8' of FIG. 7 and shows structure within one of the individually addressable and electrically settable resistance devices;

FIG. 12 is a semi-schematic, fragmentary plan view of an electrically settable resistance device provided in accordance with practice of this invention at one stage in its preparation;

FIG. 13 is a semi-schematic, fragmentary cross-sectional view of the completed electrically settable resistance device of FIG. 12;

FIG. 14 is a semi-schematic, fragmentary plan view of another embodiment of an electrically settable resistance device provided in accordance with practice of this invention at one stage in its preparation.

DETAILED DESCRIPTION

Figure 1:
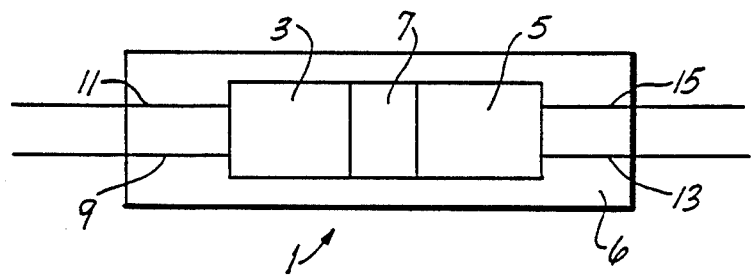
FIG. 1 is a schematic illustration for the purpose of explaining some of the principles underlying this invention.

With reference to FIG. 1, a schematically illustrated multi-layer device 1 includes a first electrode 3 and a second electrode 5. Each of the electrodes 3 and 5 is made of a redox active material provided in accordance with practice of this invention. Means including a covering layer 6 and an electrolyte 7 define an environment for each electrode such that its redox active material is reversible. A pair of terminals 9 and 11 are electrically connected to the first electrode 3 at spaced-apart locations. An electrically settable resistance is defined between the terminals 9 and 11. This resistance has a value that is a function of the oxidation state of the reversible redox active material of the first electrode 3. The terminals 9 and 11 can be connected into external circuitry so that signal current can flow in series through terminals 9, the resistance defined by electrode 3, and terminal 11. Either one of the terminals 9 and 11 can also be used to define a node of a control current flow path through the device 1, as explained more fully below. Another pair of terminals 13 and 15 are electrically connected to the device 1 at spaced-apart locations on the electrode 5. Another electrically settable resistance is defined between the terminals 13 and 15. This resistance has a value that is a function of the oxidation state of the reversible redox active material of the second electrode 5. The terminals 13 and 15 can be connected into external circuitry so that signal current can flow in series through the terminals 13, the resistance defined by the electrode 5, and the terminal 15. Either one of the terminals 13 and 15 can also be used to define a node of a control current flow path through the device 1.

The device 1 provides a single cell redox battery in which the specific resistance of the materials of the opposite electrodes can be set. The resistance between the terminals 9 and 11 is a function of the specific resistance of the redox active material of the first electrode 3. The resistance between terminals 13 and 15 is a function of the specific resistance of the redox active material of the second electrode 5. The device 1 has the advantage that it provides non-volatile memory, i.e., following the setting of a resistance to a desired value, the set resistance value can remain essentially unchanged without the need for any externally applied power.

To set a desired value for the resistance between the terminals 9 and 11, a potential is applied across the layers of the device 1. The external potential source can be connected across the terminals 13 and 9, for example. A control current flows through the device 1 in response to the applied potential in a direction that depends on the polarity of the applied potential. The control current can pass enough charge to fully reduce the redox active material of the first electrode 3. Being fully reduced, the redox active material of the electrode 3 has a set specific resistance, and the resistance between the terminals 9 and 11 has a corresponding set resistance value. Because the redox active materials used in accord with the principles of this invention are reversible, the setting of the resistance value can be repeatedly changed. To do so, the external potential source is used to apply a potential across the layers of device 1 with a polarity to cause control current to flow to re-oxidize the redox active material of the first electrode 3.

The control current flows through a terminal contacting the first electrode 3 (for example, through the terminal 9), then through the first electrode layer 3, through the electrolyte layer 7, through the second electrode layer 5, and, finally, out through the terminal contacting the second electrode 5 (for example, through the terminal 13). The control current may be positive or negative, depending on the desired resistance change. The current through the terminals is purely electronic, the current through the electrolyte layer is purely ionic, and the current through the electrode layers is mixed ionic/electronic.

Various materials may be used in making the multi-layer device 1. One redox active material that may be used in the first and second electrodes 3 and 5, respectively, is tungsten oxide ($WO_3$), suitably deposited as a one-micronthick film. A suitable material for the electrolyte 7 is polyethyleneoxide + lithium triflate ($PEO + LiCF_3SO_3$), also suitably deposited as a one-micron-thick film. The terminals 9, 11, 13 and 15 are suitably inert metal, such as gold, wires patterned by standard micro-lithographic techniques. Other electrically conductive materials that may be chosen for these terminals are electrically conducting oxides and ceramics, such as doped tin oxide, and high-temperature superconducting materials, such as $YBa_2Cu_3O_7$.

Another redox active material that may be used in the first and second electrodes 3 and 5, respectively, is polyvinylferrocene, and another suitable material for the electrolyte 7 is polyvinyl (methylpyridinium chloride).

The redox active material for the electrodes 3 and 5 may also be chosen from the following: polypyrrole, poly-3-alkylthiophene (alkyl=$C_1$ to $C_{16}$), polythiophene, polyaniline and substituted polyanilines, polyquinolines, polyquinazolines, polyacetylene and substituted polyacetylenes, polyphenylene and substituted polyphenylenes, polyphenylenesulfide, films and polymers, Prussian Blue and other metal cyanides, other metal oxides as oxides of titanium, zirconium, hafnium, vanadium, niobium, tantalum, chromium, molybdenum, tungsten, and manganese, polymers of ruthenium or osmium bipyridine/vinylbipyridine complexes, Ag/Ag+, or any other material which can be redox cycled and can also be made from dissimilar materials or from combinations of materials.

Although the redox active materials shown above are described with respect to certain solid polymers and inorganic substances, the redox active material could also be a liquid or gaseous substance, or one or more of the redox couples defining the redox active material could be a liquid or gas. For example, the redox active material could comprise the hydrogen/hydrogen ion redox couple or the bromine/bromide ion redox couple.

Only the first electrode 3 need be comprised of a redox couple whose resistance is a function of its oxidation state, as the second electrode 5 is not necessarily used as a variable resistance element. In this case, the resistance of the second electrode 5 may not change or may change in some non-linear fashion as a function of charge passed, while the resistance of the first electrode 3 responds as desired. For example, the second electrode 5 may comprise the molecular oxygen/water redox couple:

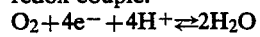
$O_2 + 4e^- + 4H^+ \rightleftharpoons 2H_2O$

Neither oxygen nor water has a suitable electronic conductivity for use as the first electrode. However, it is a suitable redox couple for the second electrode if a means is provided to control the water and oxygen content of the environment of the second electrode 5.

The material for the electrolyte 7 may also be chosen from other PEO+salt combinations, alkali metal b" alumina, nafion, $KAg_4I_5$ and other ion-conducting metal halides, and other fast ion-conducting materials. The electrolytic material should have very low electronic conductivity if the resistance set must remain unchanged for any length of time.

Figure 2:
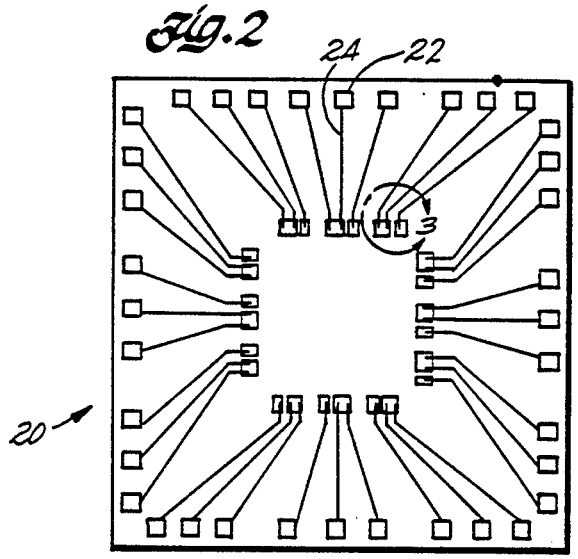
FIG. 2 shows in top plan view how a multiplicity of individually electrically settable resistance devices are incorporated in a thin film structure described in Examples 1 and 2 of the invention.
Figure 3:
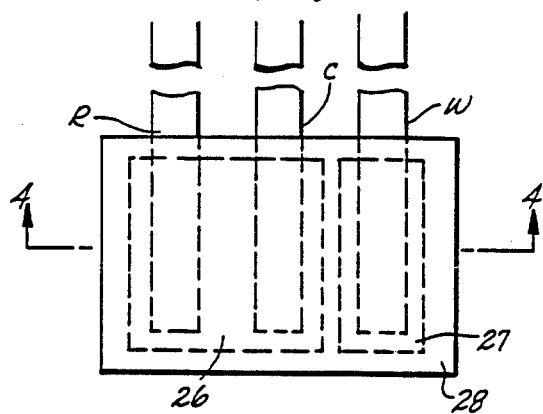
FIG. 3 is a semi-schematic plan view of the area indicated at 314 3' in FIG. 2 that is enlarged to illustrate features of one of the individually electrically settable resistance devices.

With reference to FIGS. 2, 3 and 4, there will now be set forth two specific examples (Example 1 and Example 2) of the invention, in each of which a thin film structure 20 is made to provide a multiplicity of the individually electrically settable resistance devices. The thin film structure 20 could be incorporated in various circuit arrangements including, but not limited to, mass-produced circuit arrangements for radio or TV receivers or the like which commonly incorporate factory-set potentiometers to trim the circuit arrangement into specifications. Each individually electrically settable resistance device of the thin film structure 20 is electrically insulated from the others and can be used to replace a separate such potentiometer.

The thin film structure 20 made in accord with either Example 1 or Example 2 comprises a glass substrate 21 supporting 12 devices, each of which provides an individually electrically settable resistance. Each device includes three conductors referred to as a write or "W" conductor, a read or "R" conductor, and a common or "C" conductor. Each conductor terminates at one of its ends at a pad such as the pad 22 at one end of a representative conductor 24. These pads are arranged about the periphery of the substrate and provide for making solder connections. Each device further includes a first electrode 26, a second electrode 27, and an electrolyte 28. In each device, the R and C conductors define a pair of terminals electrically connected to the first electrode 26 at spaced-apart locations, and the electrically settable resistance of the device is defined between these R and C conductors. As to the W conductor of each device, it defines a terminal electrically connected to the second electrode 27 and cooperates with the C conductor, the first and second electrodes, and the electrolyte to form a control circuit path for use in setting the resistance defined between the R and C conductors.

EXAMPLE 1

To make the thin film structure 20, 36 gold conductors and 36 terminating gold pads are laid down on the glass substrate 21 to form an array in the pattern shown in FIG. 2. In this pattern, there are 12 groups of conductors, with each group comprising R, C, and W conductors. Each conductor is 100 microns wide and 2 microns thick. In the region where the R, C, and W conductors are parallel to each other, they are on 200-micron centers.

The array and surrounding substrate are then coated with a 2-micron-thick film of a redox active material, viz, poly-3-butylthiophene, by spin coating. A layer of photoresist is applied, patterned and developed by photolithography. The areas not protected by the photoresist are then etched, either chemically or with reactive ion etching, to leave a pattern of islands of redox active material. Each island either covers a portion of a W conductor and surrounding substrate or covers and bridges between parallel portions of R and C conductors. As to the islands that cover a W conductor, each has a top surface that is generally rectangular, approximately 350 microns long (along the length of the W conductor), and approximately 150 microns wide (spanning across the 100-micron-wide conductor and 25 microns of surrounding substrate on each opposite side). As to the islands that cover and bridge between R and C conductors each has top surface that is generally square, approximately 350 microns $\times$ 350 microns with the bridging portion being approximately 100 microns $\times$ 350 microns $\times$ 2 microns. So configured, the bridging portion has an absolute resistance that is approximately 1400 ohms per ohm-cm of specific resistance of the redox active material. The islands of redox active material on the substrate are then partially oxidized either chemically or electrochemically. Then, a 5-micron-thick film of an electrolyte, viz, polyvinylpyridinium chloride, is deposited over the center of the substrate. A layer of photoresist is applied, patterned and developed by photolithography. The areas not protected by the photoresist are then etched, either chemically or with reactive ion etching, to leave a pattern of isolated cells. A final protective layer 29 of polyvinylidene chloride is then deposited. This produces 12 individually electrically settable resistance devices, each with three gold conductors leading to solder pads at the edge of the substrate. As to the environment for the redox active material of the first electrode 26, it is in contact with the R and C conductors (gold), with the substrate 21 (glass), and with the electrolyte 28 (polyvinylpyridinium chloride). As to the environment for the redox active material of the second electrode 27, it is in contact with the W conductor (gold), with the substrate 21 (glass), and with the electrolyte 28 (polyvinylpyridinium chloride).

The specific resistance of poly-3-butylthiophene varies by six orders of magnitude; in its oxidized form, its specific resistance is $10^{-2}$ ohm-cm, and in its reduced form, its specific resistance is $10^{2.4}$ ohm-cm. The reversible reaction it undergoes between its oxidized form and its reduced form is set forth below:

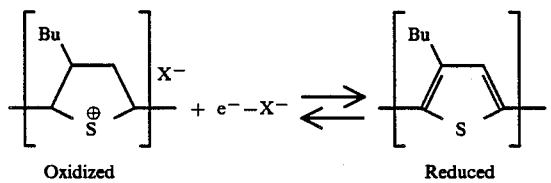

To establish a resistance setting for the individually electrically settable resistance device, a potential is temporarily applied across the W and C conductors to cause control current to flow in an appropriate direction to provide the amount of charge needed to set the specific resistance of the first electrode 26, upon which the absolute resistance between the R and C conductors depends. The maximum and minimum values to which the absolute resistance can be set, and the amount of charge needed for setting it, depend in part on the exact size and geometry of the device. For the device in the size and geometry specified above, in which a 2×350×100-micron film bridges between the R and C conductors, the minimum value of the absolute resistance is approximately 14 ohms, the maximum value of the absolute resistance is approximately 14,000,000 ohms (14 Mohms), and the maximum amount of charge needed to set the resistance (as when the resistance is being changed between the minimum value and the maximum value) is approximately 50 microcoulombs.

As to reversibility, poly-3-butylthiophene has good electrochemical reversibility; its Faradaic overpotential is below 0.5 volt. Further, the environment defined by materials in contact with the poly-3-butylthiophene electrodes is conducive to reversibility. Even in the presence of small amounts of water and/or air, the poly-3-butylthiophene is reversible.

EXAMPLE 2

An array as described in Example 1 is prepared and coated with a film of redox active material, viz, tungsten oxide, by sputtering. A layer of resist is applied, patterned and developed to leave a pattern of redox active islands, as described above in Example 1. The islands of tungsten oxide on the substrate are then partially reduced, either chemically or electrochemically, to form tungsten bronze ($Na_xWO_3$). Then, there are deposited, in sequence, a layer of sodium conducting glass and a protective layer of silica.

The specific resistance of $Na_xWO_3$ varies by over eight orders of magnitude. As to reversibility, tungsten oxide has good electrochemical reversibility; further, the environment defined by the materials in contact with the tungsten bronze electrodes is conducive to reversibility.

Figure 9:
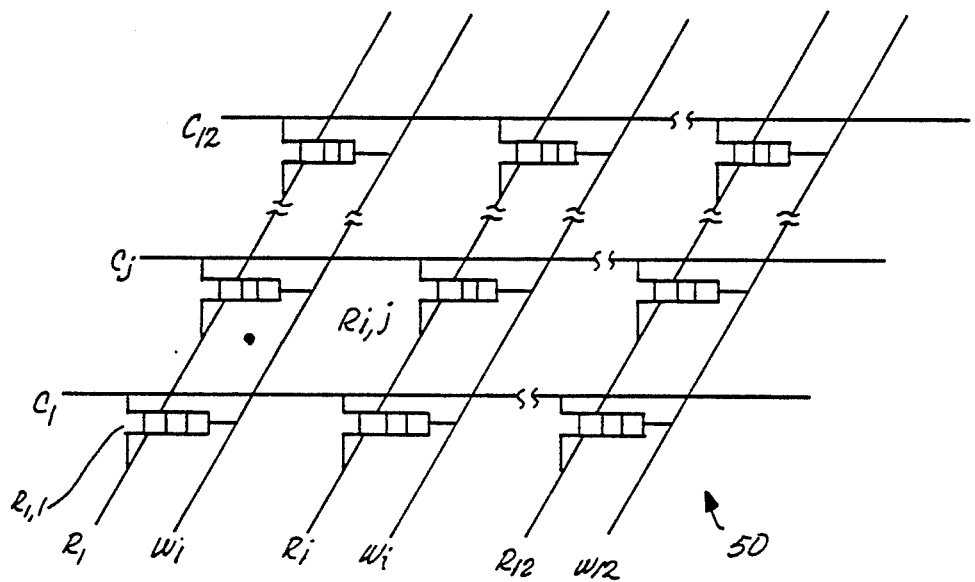
FIG. 9 is a functional block diagram of the thin film structure of Example 3.

With reference to FIGS. 5 through 9, there will now be set forth another specific example (Example 3) of the invention in which a thin film structure 50 is made to provide 144 devices arranged in an array that is addressable for writing such that the resistance of each device can be electrically set on an individual basis. The 144 resistance devices of the thin film structure 50 are interconnected to define a resistance network rather than being electrically isolated from each other for independent reading. The features of this network are such that it has numerous applications for which non-volatile memory is desirable; one such application is within an ENN in which each resistance controls the strength of connection from the output of an amplifier to the input of an amplifier. With reference to FIG. 9, the network within the thin film structure 50 defines 24 nodes; each of 12 C conductors C1 through C12 (not all shown) defines a respective one of 12 of these nodes, and each of 12 R conductors R1 through R12 (not all shown) defines a respective one of the other 12 nodes. An electrically settable resistance $R_{1,1}$ defines the strength of connection between conductor C1 and conductor R1. The value of resistance $R_{1,1}$ can be pre-set to a desired value in advance of operation of the network as part of an ENN. This pre-setting is accomplished by applying a potential, in excess of a predetermined threshold, across conductors W1 and C1. In general terms, settable resistance $R_{i,j}$ defines the strength of connection between conductor Ci and conductor Rj. Pre-setting of resistance $R_{i,j}$ is accomplished by applying a potential, in excess of a predetermined potential, across conductors Wj and Ci.

To make the thin film structure 50, 24 gold conductors and 24 gold terminating pads are deposited on the glass substrate 51 to form an array in the pattern shown in FIG. 5. Each conductor is 10 microns wide by 1 micron thick. Twelve of these conductors are provided to serve as W conductors W1 through W12; the remaining 12 conductors are provided to serve as R conductors R1 through R12. In one region of the substrate, the conductors are parallel to each other with the R and W conductors being interdigitated. In this region, the conductors are on 30 micron centers. This region is shown on an enlarged scale for clarity. The terminating pads for the W conductors are arranged in line with each other along the edge of the substrate 51 at the bottom of FIG. 5. The terminating pads for the R conductors are arranged in line with each other along the edge of substrate 51 at the top of FIG. 5. Then, there is electropolymerized on every W conductor W1 through W12 a 1-micron layer of ruthenium bis-bipyridinevinylbipyridine polymer. The ruthenium-containing polymer has a non-linear resistance and is provided so that a threshold potential will need to be exceeded to perform a W operation to set an individual resistance value in use of the completed thin film structure. An additive material is silicon dioxide; a layer of silicon dioxide defines a non-linear resistance by defining a tunnel barrier. The R conductors R1 through R12 are not coated with the ruthenium-containing polymer. Then, pyrrole is electropolymerized to cover all 24 conductors. Then, a layer of photoresist is applied, patterned and developed to leave a square array of 14-micron by 14-micron squares of electroactive polymer centered over the metal conductors. FIG. 6 shows a group of such squares on an enlarged scale. FIG. 7 shows, on a further enlarged scale, two such squares, one of which overlies W conductor $W_i$, and the other of which overlies R conductor $R_i$. Each square that overlies a W conductor has two layers; i.e., ruthenium-containing polymer layer 53 and polypyrrole layer 55. Each polypyrrole layer 55 is provided to serve as a redox active electrode electrically connected to the W conductor through layer 53. Each square that overlies an R conductor has a polypyrrole layer 57 that is provided to serve as a redox active electrode. At the stage of making thin film structure 50 to which FIGS. 6 and 7 relate, each polypyrrole layer 57 is electrically connected to an R conductor; in the completed thin film structure, each such layer is also electrically connected to a C conductor. Proceeding to the next stage, a layer of polyvinyl(methylpyridinium chloride)-copolyvinylpyridine electrolyte is deposited, and patterned by photolithography such that each pair of electroactive polymer squares is bridged by electrolyte, such as electrolyte 59 shown in FIG. 8. Then, insulating polyamide is applied and patterned to form a layer 60 from which depend 3-micron×3-micron×3-micron channels or vias 62, each of which is centered over and extends down to one of the polypyrrole electrodes for an R conductor. Finally, gold is deposited and patterned to form an array of 12 parallel gold conductors and 12 gold terminating pads, with the 12 gold conductors being perpendicular to the first 24 conductors such that contact is made through the vias in the insulating polyamide to the polypyrrole electrodes for the C conductors. These top conductors are the C conductors C1 through C12. Then, insulating polyamide is deposited to form a final protective layer 65 to complete the making of thin film structure 50. The 144 devices are individually addressable for writing using any pair of C and W lines. The resistance of each device is a function of the oxidation state of the electrode, such as the electrode 57 that has a C conductor electrically connected to its top surface and an R conductor electrically connected to its bottom surface. Each such resistance is adjustable over the range $10^3$ ohm to $10^6$ ohm. A fully-charged device maintains its charge such that less than 1% of the charge is lost over a 24-hour period. Charging and discharging potentials are less than 3 volts.

The thin film structure 50 is a specific example in which the multiple cells define a square (12×12) matrix. Such a matrix can be made rectangular by, for example, providing more pairs of W and R conductors than the number of C conductors.

Figure 10:
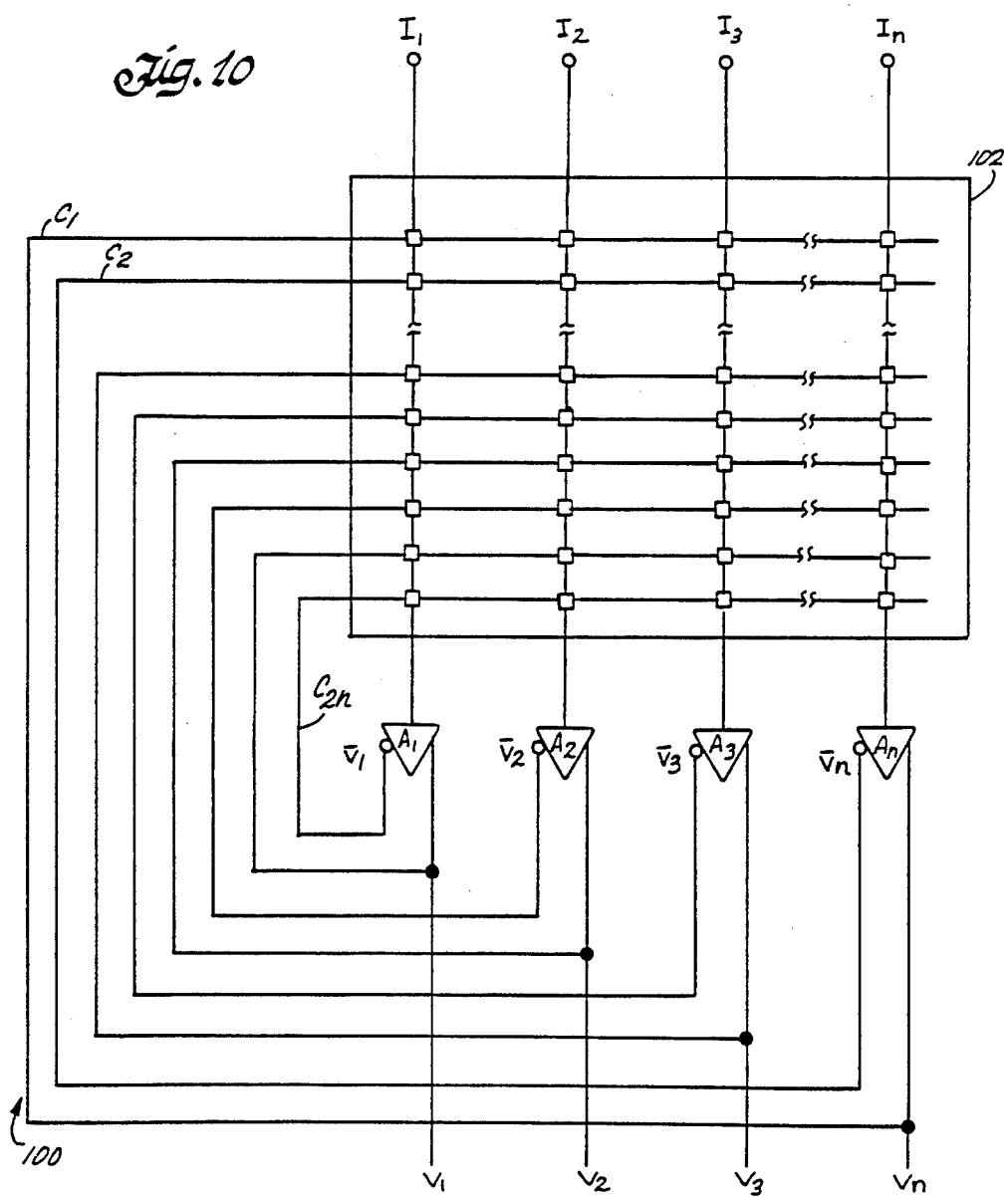
FIG. 10 is a block and schematic diagram of a model neural network for one type of electronic neural network embodying the invention.

With reference now to FIG. 10, a model neural network 100 includes a set of amplifiers $A_1$ through $A_n$ that are arranged in the same way as the amplifiers shown in the above-cited article in *Science,* by J. J. Hopfield, et al. Each amplifier has an input, a non-inverting output, and an inverting output. Each non-inverting output produces a voltage signal referenced as $V_1$ through $V_n$; each inverting output produces a voltage signal referenced as $\overline{V}_1$ through $\overline{V}_n$. Each amplifier has a non-linear input current to output voltage characteristic. A thin film structure 102 interconnects the amplifiers to establish strengths of connection between the amplifiers. The specific interconnection arrangement of model neural network 100 conforms to a specific constraint. That is, each amplifier is effectively connected to one, and only one, of the outputs of each of the other amplifiers. As to being "effectively connected" or not, this matter can turn on relative values of resistances. A resistance that provides an effective connection has a substantially lower value than a resistance that does not. The C conductors $C_1$ through $C_{2n}$ of thin film structure 102 are directly connected to the outputs of amplifiers $A_1$ through $A_n$, and are connected to inputs $I_1$ through $I_n$. The R conductors $R_1$ through $R_n$ are connected as shown to satisfy the specific constraint set forth above. For clarity, FIG. 10 does not show the W conductors that are used together with the C conductors in pre-setting the resistance values within thin film structure 102. Further, the resistances that are pre-set to provide effective connections are symbolized in FIG. 10 by small squares at intersections of R and C conductors.

Figure 11:
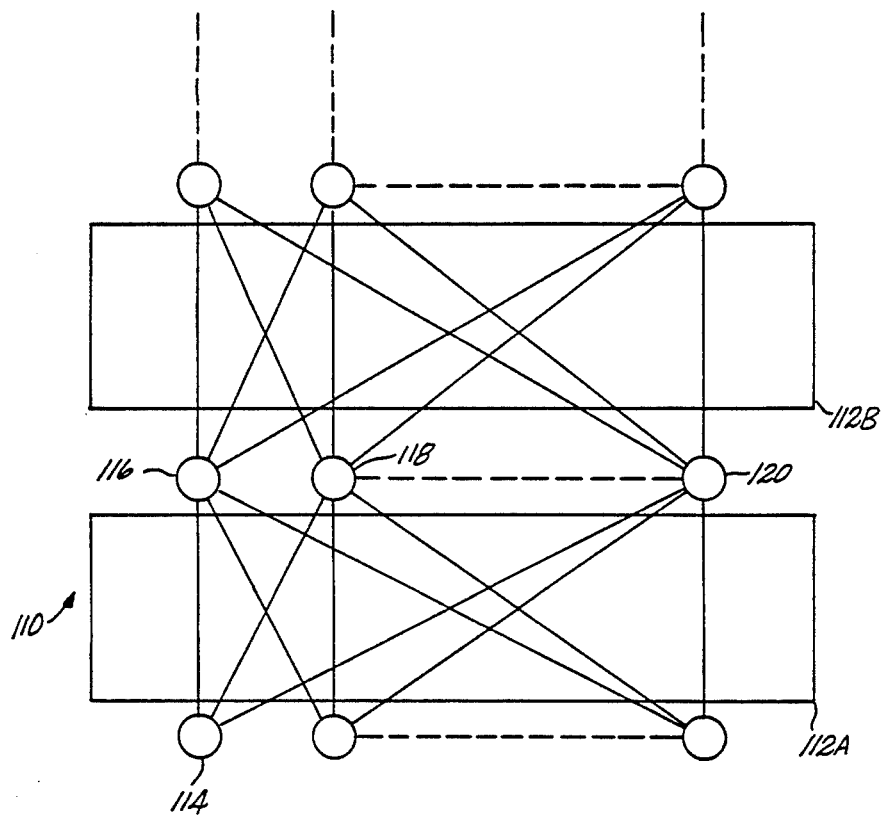
FIG. 11 is a block and schematic diagram of a layered neural network type of electronic neural network embodying the invention.

FIG. 11 shows in functional block diagram form an alternative embodiment in which an ENN 110 comprises a set of amplifiers that are interconnected by multi-cell means to form a layered neural network. In FIG. 11, the amplifiers are symbolized by circles, and the multi-cell means is symbolized by a group of blocks, of which block 112A and 112B represent sections of a thin film structure made in accord with the same principles as the thin film structures described above. The pre-settable resistances of the thin film structure establish strengths of connections between the amplifiers.

For clarity, not all of the amplifiers are shown in FIG. 11 but only such representative amplifiers as provide for illustrating how the amplifiers are interconnected. As shown, an amplifier 114 in one layer of ENN 110 is connected through individually pre-set resistances of section 112A to each amplifier, such as amplifiers 116, 118, and 120, at the next layer of ENN 110.

The number of layers of ENN 110 may be chosen in accord with well-known principles. Further, the number of amplifiers provided at any given layer may be chosen in accord with such principles. For example, a layered neural network type of ENN can be arranged so that 18 amplifiers are interconnected, whereby seven amplifiers in a first layer feeding forward to four amplifiers in a second layer, which in turn feed forward to five amplifiers in a third layer, which in turn feed forward to two amplifiers in the fourth layer. In such case, the resistances of the multi-cell means provide 28 effective connections from the first to the second layers, 20 more effective connections from the second to the third layers, and 10 more effective connections from the third to the fourth layers.

Several exemplary embodiments of devices provided in accordance with practice of this invention, the processes for making the devices, and test results relating to the resistance of the redox material as a function of the charge passed through the material, are described in the following Examples 4 through 7.

EXAMPLE 4

Turning to FIG. 12, there is shown a semi-schematic, fragmentary plan view of an exemplary embodiment of an electrically settable resistance device 130 at one stage in its preparation in accordance with this invention, wherein a gold pattern 132 is in place on a polyester film 134. The pattern 132 was prepared using "Kodak" Technical Pan 35mm film, developed with "Kodak" D-19 developer. The camera was positioned to give a 40:1 reduction from original artwork to developed film. A 2.5×7.5cm piece of "Intrex" G type 1 gold on polyester film provided by Sierracin Corporation of Sylmar, Calif., was spin-coated at 2500rpm for 15 seconds with a negative photoresist provided by KTI Chemicals, Inc., of Sunnyvale, Calif., under the trademark "747." The photoresist was allowed to air-dry in the dark for 24 hours. The resist-coated film was then patterned by contact exposure of a photomask (not shown) with two 4-watts 366nm UV bulbs and placed 10 centimeters from the film for 30 seconds. The exposed film was developed for one minute in a developer provided by KTI Chemicals. The pattern was then etched into the gold using aqueous 1-molar sodium triiodide for 10 seconds, followed by rinsing with water. The exposed resist was then stripped by washing with toluene for three minutes in an ultrasonic cleaner. The film was then cut by hand to give a resulting gold pattern 132 corresponding to the photomask.

The gold pattern 132 comprised two L-shaped gold terminals 136 and 138, with the bases 140 and 142 of the L's facing each other. The closest spacing between the terminals was provided by a gap 144 between the facing portions of the bases 140 and 142 which was 25 microns across and 312 microns long. The gold terminals 136 and 138 corresponded to the R and C terminals, respectively, of the device 130. The top portions 136a and 138a of the terminals 136 and 138, respectively, provided contact pads which were used to make external electrical connection to the terminals.

An electrical connection was made to each of the contact pads 136a and 138a, using an edge connector (not shown) with gold-plated contacts. The connector was oriented so that the gap 144 and adjacent terminal area could be immersed into electrolyte solution without wetting the edge connector or contact pads. The electrolyte solution was acetonitrile 0.01 molar in tetraethylammonium tetrafluoroborate and 0.1 molar in 3-methylthiophene. 3-methylthiophene was electropolymerized onto the part of the pattern 132 immersed in electrolyte solution by potentiostating both the R and C terminals 136 and 138 at three volts versus a silver wire reference electrode. Polymerization was stopped when the polymethylthiophene film could be seen to cover the gap 144 between the R and C terminals. The pattern was removed from the electrolyte, washed with acetone, and dried.

A solid polymer electrolyte (SPE) was then deposited by placing a drop of a solution of poly-co-ethyleneoxidepropyleneoxide 5:1, provided by Polyscience Company of Warrington, Penn., 2 molar and lithium tetrafluoroborate 0.1 molar in ethanol (this solution is referred to below as SPE solution) with a pipette such that it completely covered the polymethylthiophene layer. The solvent was allowed to evaporate at room temperature to leave the SPE film.

Turning to FIG. 13, a semi-schematic, fragmentary cross-sectional representation of a completed device 130 provided in accordance with Example 4 is shown. The device includes the polyester film layer 134, the gold R and C terminals 136 and 138, respectively, with the gap 144 between them, the polymethylthiophene electrode film was provided as the layer 146, and the solid polymer electrolyte was provided as the layer 148. The W terminal 150 was provided as a 3mm×30mm strip of "Intrex" G polyester film 152, having a gold layer 154 thereon. An approximately 3mm×3mm section at one end of the W terminal was coated with a polymethylthiophene layer 156, using the same process used to produce the polymethylthiophene layer 146. The polymethylthiophene was then electrochemically reduced at zero volts versus silver wire reference in acetonitrile 0.01 molar in tetraethylammonium tetrafluoroborate, rinsed with acetone, and dried. An SPE film 158 was then deposited onto the polymethylthiophene layer 156.

The R and C terminal portions of the device 130 and the W terminal portion were sandwiched such that the top-most polyelectrolyte layer 148 of the R and C terminal portions was in contact with the polyelectrolyte layer 158, and the W terminal was positioned directly over the length of the gap 144 between the R and C terminals 136 and 138, respectively. Electrical contact was made using edge connectors (not shown) to the terminals 136 and 138 and a separate edge connector (not shown) to the W terminal 150.

The resistance between the R and C terminals was measured as a function of the total charge passed between the W and C terminals. The results are shown in Table 1.

TABLE 1

| Total Charge Passed Between W and C ($10^{-4}$ coulomb) | Resistance Between R and C (Kohm) |
| --- | --- |
| 0 | 8.7 |
| −0.719 | 77.5 |
| −1.29 | 862 |
| −0.152 | 6.3 |
| +1.10 | 2.1 |
| +3.08 | 0.5 |
| +1.87 | 3.5 |
| +1.43 | 48.7 |
| +1.02 | 128 |
| +0.58 | 563 |
| +1.00 | 14 |
| +2.34 | 1.4 |
| +2.66 | 1.2 |
| +1.84 | 8.1 |
| +1.61 | 10.5 |
| +1.41 | 13.8 |
| +1.12 | 16.8 |
| +0.78 | 37 |
| +0.62 | 96.8 |
| +0.36 | 120 |
| +0.104 | 139 |
| +1.14 | 19 |
| +1.40 | 7.6 |
| +1.87 | 1.5 |
| +2.40 | 0.90 |
| +3.15 | 0.45 |
| +2.44 | 1.3 |
| +2.03 | 2.5 |
| +1.67 | 7.0 |
| +1.35 | 17.8 |
| +0.95 | 40 |
| +0.75 | 389 |
| +0.38 | 1290 |
| +1.68 | 1.9 |
| +2.17 | 0.70 |
| +2.71 | 0.45 |
| +3.30 | 0.34 |
| +4.06 | 0.28 |
| +5.03 | 0.23 |
| +2.42 | 4.0 |
| +1.66 | 892 |
| −0.43 | 2200 |
| −1.04 | 2500 |
| +0.76 | 11 |

The resistance is shown in Example 4 to be a function of stored charge or integrated current. Further, the data of Table 1 shows that reversing the current being passed through the redox active material reverses the change in resistance of the material.

EXAMPLE 5

Turning to FIG. 14, there is shown a semi-schematic, fragmentary plan view of an exemplary embodiment of an electrically settable resistance device 160 at one stage in its preparation in accordance with this invention, wherein a gold pattern 162 is in place on a polyester film 164. The pattern was prepared using a different photomask, but the same steps, that were used in preparing the gold pattern 132 of the device described in Example 4. The pattern 162 has four gold terminals, 166, 168, 170, and 172. The terminals 166 and 170 are, respectively, the R and C terminals. The terminals 168 and 172 are the W terminals.

The R terminal 166 and the C terminal 170 are L-shaped, with their bases 174 and 176, respectively, facing each other. The closest spacing between the R and C terminals is a gap 178, which is 50 microns across. The horizontally extending bottom end 169 of the first W terminal 68 is adjacent and above the gap 178, and the horizontally extending bottom end 173 of the second W terminal 172 is adjacent and below the gap 178. The distance from the end 169 of the W terminal 168 to the horizontally extending top portions of the bases 174 and 176 of the terminals 166 and 170, respectively, and from the top of the gap 178, is 50 microns. The distance from the end 173 of the W terminal 172 to the horizontally extending bottom portions of the bases 174 and 76 of the terminals 166 and 170, respectively, is 50 microns. Thus, a horizontally extending 50-micron gap 180 extends between the end 169 of the W terminal 168 and the horizontal top portions of the bases 174 and 176, and a horizontally extending 50-micron gap 182 extends between the end 173 of the W terminal 172 and the horizontal bottom portions of the bases 174 and 176. The top portions 166a, 168a, 170a and 172a of the terminals 166, 168, 170 and 172, respectively, provide contact pads which are used to make external electrical connections.

An electrical connection was made to each of the contact pads 166a, 168a, 170a and 172a, using an edge connector (not shown) with gold-plated contacts. The connector was oriented so that the gaps 178, 180 and 182 and adjacent terminal area could be immersed into electrolyte solution without wetting the edge connector or contact pads. The electrolyte solution was acetonitrile 0.01 molar in tetraethylammonium tetrafluoroborate and 0.1 molar in 3-methylthiophene. The monomer, 3-methylthiophene, was electropolymerized onto the part of the pattern immersed in electrolyte solution by potentiostating the R, C and W terminals 166, 168, 170 and 172 at three volts versus a silver wire reference electrode. Polymerization was stopped when the polymethylthiophene film could be seen to cover the gap 178 between the ends 174 and 176 of the R and C terminals 166 and 170. The pattern was removed from the electrolyte, washed with acetonitrile, and transferred to a separate electrochemical cell containing acetonitrile 0.01 molar in tetraethylammonium tetrafluoroborate and partially reduced at zero volts versus silver wire electrode. The pattern was removed from the electrolyte, washed with acetone, and dried. At this point, the polymethylthiophene film covered the gaps 178, 180 and 182. The polymethylthiophene was removed from the gaps 180 and 182 by providing a score mark through the polymethylthiophene with a razor blade. These score marks were about 50 microns across and were positioned as close as possible to the ends 169 and 173 of the W terminals 168 and 172, respectively. An ohmmeter was used to check that the W terminals were not connected to the other terminals by polythiophene; i.e., that an open circuit had been obtained.

A solid polymer electrolyte was then deposited onto the polymethylthiophene film by the same procedure that was used in Example 4. A drop of the SPE solution was deposited with a pipette such that it completely covered the polymethylthiophene film and the score marks separating the W terminals and the R and C terminals. The solvent was evaporated to leave the SPE film.

The resistance between the R and C terminals 166 and 170, respectively, was then measured as a function of the total charge passed between the W terminals 168 and 172 and the C terminal 170. The results are shown in Tables 2 and 3.

TABLE 2

| Volts W to C (Volt) | Total Charge Passed Between W and C ($10^{-4}$ coulomb) | Resistance Between R and C (Kohm) |
|---|---|---|
| 0 | 0 | 3600 |
| −3.5 | −2.7 | 0.60 |
| +3.5 | −1.8 | 3.0 |
| +3.5 | −0.5 | 10 |
| +3.5 | −0.2 | 78 |
| +3.5 | −0.02 | 133 |
| +3.75 | +0.02 | 177 |
| +3.92 | +0.03 | 281 |
| +3.92 | +0.05 | 363 |
| +3.92 | +0.13 | 423 |
| +3.92 | +0.36 | 481 |
| +3.92 | +0.67 | 572 |
| +3.92 | +1.00 | 665 |
| +3.92 | +1.23 | 719 |
| +3.92 | +1.55 | 784 |
| +3.92 | +2.52 | 874 |
| +3.92 | +3.80 | 1250 |
| +3.92 | +6.99 | 1950 |
| +3.92 | +8.26 | 2750 |
| −2.92 | +3.53 | 0.25 |
| −2.92 | +2.09 | 0.22 |
| −2.92 | +0.5 | 0.20 |
| +2.92 | +6.4 | 450 |
| +2.92 | +7.4 | 521 |
| +3.5 | +10.0 | 700 |
| +3.5 | +14.9 | 900 |
| +3.5 | +18.3 | 1000 |
| +3.5 | +20.3 | 1100 |
| +3.92 | +22.6 | 1175 |
| −2.92 | +11.1 | 0.18 |
| +3.92 | +17.5 | 5600 |
| −2.92 | +11.7 | 0.23 |
| +3.92 | +17.8 | 5900 |
| −2.92 | +10.2 | 0.22 |

TABLE 3

| Total Charge Passed Between W and C (coulomb) | Resistance Between R and C (Kohm) |
|---|---|
| 0 | 8.9 |
| −3.9 | 5.2 |
| −7.1 | 4.8 |
| 1.7 | 77 |
| 5.1 | 194 |
| 9.7 | 484 |
| 5.1 | 10.3 |
| 4.2 | 8.6 |
| 4.7 | 17.6 |
| 6.2 | 60 |
| 6.7 | 75 |
| 7.2 | 78 |
| 9.4 | 165 |
| 11.1 | 322 |
| 14 | 504 |
| 9.5 | 23 |
| 8.8 | 19 |
| 9.7 | 60 |
| 10.8 | 155 |
| 12.4 | 215 |
| 13 | 221 |
| 104 | |
| 12 | 341 |
| 10.8 | 23 |
| 9.9 | 16 |
| 8.9 | 45 |
| 10.3 | 66 |
| 11.0 | |

EXAMPLE 6

A gold pattern (not shown) was prepared as described above for Example 5. The pattern was identical to the pattern 162, except that the gaps 180 and 182 were 350 microns across instead of 50 microns. The gap 178 remained 50 microns across, as it was for the device of Example 5. By providing the gaps 180 and 182 of this Example at 350 microns, the need to score the polymethylthiophene film with a razor was eliminated.

Poly-3-methylthiophene was electropolymerized onto the gold pattern as in Example 5 above, taking care to stop the polymerization before the gaps 180 and 182 were bridged with polymer. The SPE was deposited onto the poly-3-methylthiophene, as in Example 5.

The resistance between the R and C terminals 166 and 170, respectively, was then measured as a function of the total charge passed between the W terminals 168 and 172 and C terminal 170. The results are shown in Table 4.

TABLE 4

| Potential Applied to W and C (volt) | Total Charge Passed Between W and C (microcoulomb) | Resistance Between R and C (Kohm) |
| --- | --- | --- |
| 0 | 0 | 15 |
| +3.75 | 11.3 | 2.5 |
| +3.75 | 30.7 | 1.2 |
| +3.75 | 36.2 | 1.0 |
| +3.75 | 49.7 | 0.8 |
| +3.75 | 80.7 | 0.7 |
| −3.75 | 71.7 | 1.25 |
| −3.75 | 63.9 | 1.9 |
| −3.75 | 46.9 | 6.9 |
| −3.75 | 34.6 | 51 |
| −3.75 | 30.2 | 69 |
| −3.75 | 8.34 | 107 |
| −3.75 | −7.11 | 118 |
| −3.75 | −26.7 | 132 |
| −3.75 | −515 | 135 |
| −3.75 | −795 | 145 |

EXAMPLE 7

A device (not shown) having the same gold pattern as the device 160 of Example 5 was formed using the same method of Example 5, except that the redox material coated onto the gold was tungsten oxide. An electrolyte solution was prepared by adding, at 35° C., 5 milliliters of an aqueous 0.2-molar sodium tungstate dihydrate solution to 45 milliliters of 2.2-molar sulfuric acid, while bubbling with nitrogen to stir and deaerate. Immediately upon addition, a colloidal suspension formed. This solution was maintained at 35° C. and used immediately as a white precipitate formed in about one hour. Connection was made to the pattern with an edge connector so that the terminals could be immersed about 5 millimeters into the electrolyte solution. Using a platinum auxiliary electrode and saturated calomel reference electrode, all four terminals of the pattern were potentiostated together, and the potential was scanned between −0.4 and +0.8 volt and 50 mv/sec for one hour. The pattern was removed from the electrolyte, rinsed with water, then rinsed with acetone, and air-dried. The tungsten oxide film bridging from the W terminal to the R terminal, and from the W terminal to the C terminal, was removed by scoring the film with a razor blade to leave gaps of approximately 50 microns. SPE solution was applied to cover all of the tungsten oxide film, and the solution was allowed to dry.

The resistance between the R and C terminals was then measured as a function of the total charge passed between the W and C terminals. The results are shown in Table 5.

TABLE 5

| Potential Applied to W and C (volt) | Total Charge Passed Between W and C (microcoulomb) | Resistance Between R and C (Kohm) |
| --- | --- | --- |
| 0 | 0 | 4000 |
| −2 | −0.09 | 1100 |
| −2 | −0.18 | 1070 |
| −2 | −0.38 | 696 |
| −2 | −0.68 | 162 |
| −2 | −0.82 | 129 |
| −2 | −1.2 | 90 |
| −2.5 | −1.5 | 74 |
| −3 | −1.8 | 62 |
| −3 | −2.5 | 43 |
| −3 | −3.1 | 36 |
| −3 | −4.5 | 28 |
| −3.5 | −4.9 | 27 |
| −3.5 | −7.6 | 20 |
| −3.75 | −9.4 | 19 |
| +3.75 | −9.2 | 1000 |
| +3.75 | −8.0 | 1500 |
| −3.75 | −10 | 400 |
| −3.75 | −12 | 183 |
| −3.75 | −13 | 138 |

The above description of preferred embodiments of devices provided in accordance with practice of principles of this invention is for illustrative purposes. Because of variations which will be apparent to those skilled in the art, the present invention is not intended to be limited to the particular embodiments described above. The scope of the invention is defined in the following claims.

What is claimed is:

1. A device for providing an electrically settable resistance which comprises:

first and second electrodes, each comprising a redox active material;

an electrolyte between the electrodes;

a pair of terminals electrically connected to the first electrode at spaced-apart locations, the electrically settable resistance being defined between the pair of terminals, and being a function of the oxidation state of the first electrode; and means, including a terminal electrically connected to the second electrode, for defining a control circuit path, including the first and second electrodes and the electrolyte, to enable a control current flowing through the control circuit path to change the oxidation state of the first electrode so that control current flowing in one direction sets the resistance of the first electrode to a lower value and control current flowing in the opposite direction sets the resistance of the first electrode to a higher value.

2. A device according to claim 1 including means defining an environment for the first and second electrodes such that the redox active material of each such electrode is reversible, and wherein the environment includes the electrolyte.

3. A device according to claim 1 wherein the redox active materials of both the first and second electrodes and the electrolyte are in the solid state.

4. A device according to claim 1 wherein the redox active material of both the first and second electrodes in its reduced state is a metal.

5. A device according to claim 2 wherein the terminal electrically connected to the second electrode is a metal conductor.

6. A device according to claim 5 wherein the metal conductor consists essentially of inert metal and is in contact with the second electrode and thereby forms part of the environment-defining means.

7. A device according to claim 5 wherein the metal conductor is electrically connected to the second electrode through a layer of material having a non-linear resistance.

8. A device according to claim 7 wherein the layer of material comprises a ruthenium-containing polymer.

9. A device according to claim 7 wherein the layer of material comprises a silicon dioxide tunnel barrier.

10. A device according to claim 1 wherein the redox active material of at least one of the electrodes comprises the hydrogen/hydrogen ion redox couple.

11. A device according to claim 1 wherein the redox active material of at least one of the electrodes in either the fully-oxidized or fully-reduced state is a gas or a liquid.

12. A thin film structure comprising:
a substrate supporting a multiplicity of cells, each cell providing an individually electrically settable resistance;
each cell including:
a deposit of redox active material defining a first electrode;
a deposit of redox active material defining a second electrode; and
a deposit of material defining an electrolyte between the first and second electrodes;
the substrate further supporting a multiplicity of conductors arranged in a pattern to communicate electrically with each cell such that at each cell two of the conductors are electrically connected to the first electrode at spaced-apart locations, the electrically settable resistance of the cell being defined between the two conductors, and such that another of the conductors is electrically connected to the second electrode to provide for defining a control circuit path, including the first and second electrodes and the electrolyte, to enable a control current path flowing through the control circuit path in one direction to set the resistance of the cell to a lower value or, in the opposite direction, to set the resistance of the cell to a higher value.

13. A device according to claim 12 wherein the redox active materials of both the first and second electrodes and the electrolyte are in the solid state.

14. A device according to claim 12 wherein the redox active material of both the first and second electrodes in its reduced state is a metal.

15. A device according to claim 12 wherein the conductor electrically connected to the second electrode is a metal conductor.

16. A device according to claim 15 wherein the metal conductor is electrically connected to the second electrode through a layer of material having a non-linear resistance.

17. A device according to claim 16 wherein the layer of material comprises a ruthenium-containing polymer.

18. A device according to claim 16 wherein the layer of material comprises the silicon dioxide tunnel barrier.

19. A device according to claim 12 wherein the redox active material of the first electrode comprises the hydrogen/hydrogen ion redox couple.

20. A device according to claim 12 wherein the redox active material of the first electrode in either the fully-oxidized or fully-reduced state is a gas or a liquid.

21. An electronic neural network comprising:
a set of amplifiers:
multi-cell means embodied in thin film structure for interconnecting the amplifiers to establish strengths of connection between the amplifiers;
the multi-cell means defining a network of electrically settable resistances, each of which is formed by a redox active material and has a resistance value that is a function of the oxidation state of the redox active material.

22. An electronic neural network according to claim 21 in which the multi-cell means interconnects the amplifiers to form a Hopfield ENN.

23. An electronic neural network according to claim 21 in which the multi-cell means interconnects the amplifiers to form a layered neural network.

24. A device for providing an electrically settable resistance which comprises:
first and second electrodes, each comprising a redox active material;
means defining an environment for each electrode such that the average redox state of the electrodes, taken together, remains substantially constant;
the environment-defining means including an electrolyte between the electrodes;
a pair of terminals electrically connected to the first electrode at spaced-apart locations, the electrically settable resistance being defined between the pair of terminals and being a function of the oxidation state of the first electrode; and
means, including a terminal electrically connected to the second electrode, for defining a control circuit path, including the first and second electrodes and the electrolyte, to enable a control current flowing through the control circuit path to change the oxidation state of the first electrode so that control current flowing in one direction sets the resistance to a lower value and control current flowing in the opposite direction sets the resistance to a higher value.

25. A device according to claim 24 wherein the redox active materials of both the first and second electrodes and the electrolyte are in the solid state.

26. A device according to claim 24 wherein the redox active material of both the first and second electrodes in its reduced state is a metal.

27. A device according to claim 24 wherein the terminal electrically connected to the second electrode is a metal conductor.

28. A device according to claim 27 wherein the metal conductor consists essentially of inert metal and is in contact with the second electrode and thereby forms part of the environment-defining means.

29. A device according to claim 27 wherein the metal conductor is electrically connected to the second electrode through a layer of material having a non-linear resistance.

30. A device according to claim 29 wherein the layer of material comprises a ruthenium-containing polymer.

31. A device according to claim 29 wherein the layer of material comprises a silicon dioxide tunnel barrier.

32. An electrochemical memory device which comprises:
first and second electrodes, each comprising a redox active material;
an electrolyte between the electrodes;
a pair of terminals electrically connected to the first electrode at spaced-apart locations, an electrically settable resistance being defined between the pair of terminals and being a function of the oxidation state of the first electrode; and means, including a terminal electrically connected to the second electrode, for defining a control circuit path, including the first and second electrodes and the electrolyte, to enable a control current flowing through the control circuit path to change the oxidation state of the first electrode so that control current flowing in one direction sets the resistance to a lower value and control current flowing in the opposite direction sets the resistance to a higher value, the set resistance defining the state of the memory device and the stored information.

* * * * *

UNITED STATES PATENT AND TRADEMARK OFFICE
CERTIFICATE OF CORRECTION

PATENT NO. : 4,945,257

DATED : July 31, 1990

INVENTOR(S) : Matthew L. Marrocco, III

It is certified that error appears in the above-identified patent and that said Letters Patent is hereby corrected as shown below:

Column 1, Line 8, After "application is a" insert --Continuation-In-Part of application--; Column 3, Line 24, Change "Processino" to -- Processing --; Column 3, Line 33, After "(2)" delete the period; Column 6, Line 63, Delete "3143'" and insert therefor -- 3-3' --; Column 11, Line 51, Change "NaxW0$_3$" to -- Na$_x$W0$_3$ --; Column 12, Lines 20, 21, Between lines 20 and 21 of the patent insert the heading -- EXAMPLE 3 --; Column 13, Lines 8, 9, Change "3-micron x 3-micron x 3-micron" to -- 3-micron x 3-micron --; Column 15, Lines 30, 31, Delete the space between the words "of" and "Warrington"; Column 17, Line 1, Change "68" to -- 168 --; Column 17, Line 9, Change "76" to -- 176 --.

Signed and Sealed this

Seventh Day of April, 1992

Attest:

HARRY F. MANBECK, JR.

*Attesting Officer*     *Commissioner of Patents and Trademarks*